(12) United States Patent
Lee et al.

(10) Patent No.: US 8,423,841 B1
(45) Date of Patent: *Apr. 16, 2013

(54) METHOD AND SYSTEMS FOR MEMORY TESTING AND TEST DATA REPORTING DURING MEMORY TESTING

(75) Inventors: Winston Lee, Palo Alto, CA (US); Albert Wu, Palo Alto, CA (US); Chorng-Lii Liou, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 28 days.

This patent is subject to a terminal disclaimer.

(21) Appl. No.: 13/118,739

(22) Filed: May 31, 2011

Related U.S. Application Data

(60) Continuation of application No. 12/766,809, filed on Apr. 23, 2010, now Pat. No. 7,958,413, which is a division of application No. 11/679,133, filed on Feb. 26, 2007, now Pat. No. 7,734,966, which is a division of application No. 10/734,420, filed on Dec. 11, 2003, now abandoned.

(60) Provisional application No. 60/436,805, filed on Dec. 26, 2002.

(51) Int. Cl.
*G11C 29/00* (2006.01)

(52) U.S. Cl.
USPC .......... 714/718; 714/2; 714/6.1; 714/6.2; 714/6.32; 714/25; 714/26; 714/30; 714/42; 714/48; 714/710; 714/711; 714/719; 714/723; 714/733; 714/734; 714/736; 365/201

(58) Field of Classification Search .............. None
See application file for complete search history.

(56) References Cited

U.S. PATENT DOCUMENTS

| 5,568,437 | A | 10/1996 | Jamal |
|---|---|---|---|
| 6,044,481 | A | 3/2000 | Kornachuk et al. |
| 6,243,307 | B1 | 6/2001 | Kawagoe |
| 6,367,042 | B1 | 4/2002 | Phan et al. |
| 6,370,661 | B1 | 4/2002 | Miner |
| 6,381,715 | B1 | 4/2002 | Bauman et al. |
| 6,404,684 | B2 | 6/2002 | Arimoto et al. |
| 6,408,401 | B1 | 6/2002 | Bhavsar et al. |

(Continued)

FOREIGN PATENT DOCUMENTS

EP 1031994 A1 8/2000

*Primary Examiner* — John Trimmings

(57) ABSTRACT

The present invention provides a method and system for improving memory testing efficiency, raising the speed of memory testing, detecting memory failures occurring at the memory operating frequency, and reducing data reported for redundancy repair analysis. The memory testing system includes a first memory tester extracting failed memory location information from the memory at a higher memory operating frequency, an external memory tester receiving failed memory location information at a lower memory tester frequency, and an interface between the first memory tester and the external memory tester. The memory testing method uses data strobes at the memory tester frequency to clock out failed memory location information obtained at the higher memory operating frequency. In addition, the inventive method reports only enough information to the external memory tester for it to determine row, column and single bit failures repairable with the available redundant resources. The present invention further provides a redundant resource allocation system, which uses a bad location list and an associated bad location list to classify failed memory locations according to a predetermined priority sequence, and allocates redundant resources to repair the failed memory locations according to the priority sequence.

19 Claims, 14 Drawing Sheets

U.S. PATENT DOCUMENTS

| | | |
|---|---|---|
| 6,486,493 B2 | 11/2002 | Arimoto et al. |
| 6,493,647 B1 | 12/2002 | Chiang et al. |
| 6,493,839 B1 | 12/2002 | Miner |
| 6,496,947 B1 | 12/2002 | Schwarz |
| 6,643,807 B1 | 11/2003 | Heaslip et al. |
| 6,681,359 B1 | 1/2004 | Au et al. |
| 6,721,904 B2 | 4/2004 | Ernst et al. |
| 6,725,403 B1 * | 4/2004 | Schmoelz ............... 714/723 |
| 6,738,938 B2 | 5/2004 | Nadeau-Dostie et al. |
| 6,862,704 B1 | 3/2005 | Miner |
| 6,904,552 B2 | 6/2005 | Cowles |
| 6,993,696 B1 | 1/2006 | Tanizaki et al. |
| 7,010,736 B1 | 3/2006 | Teh et al. |
| 7,114,024 B2 * | 9/2006 | Herbst ..................... 711/100 |
| 7,178,072 B2 * | 2/2007 | Mullins et al. ........... 714/711 |
| 2001/0056557 A1 | 12/2001 | Kawagoe et al. |
| 2002/0066057 A1 * | 5/2002 | Daehn ..................... 714/723 |
| 2002/0087926 A1 | 7/2002 | Kuhn et al. |
| 2002/0194558 A1 | 12/2002 | Wang et al. |
| 2003/0005353 A1 | 1/2003 | Mullins et al. |
| 2003/0097626 A1 | 5/2003 | Tseng et al. |
| 2004/0093540 A1 | 5/2004 | Adams et al. |
| 2004/0133826 A1 | 7/2004 | Zhu et al. |

\* cited by examiner

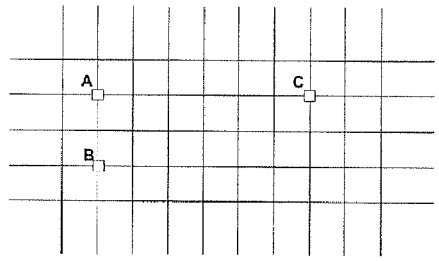
Fig. 5a
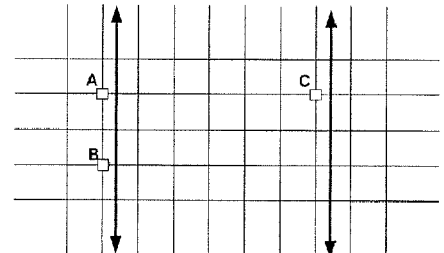
Fig. 5b
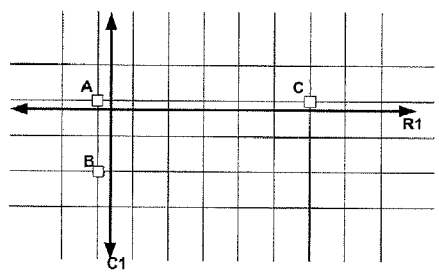
Fig. 5c
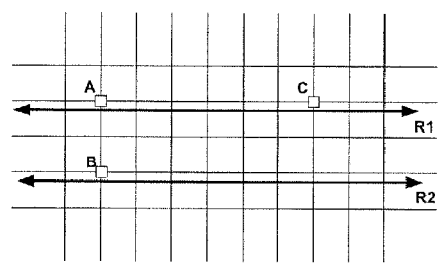
Fig. 5d
| ROW | COLUMN | BIT POSITION | EV | RGT1 | RGTX | CGT1 | CGTX | RF | CF |
|---|---|---|---|---|---|---|---|---|---|
| Row Addr A | Col Addr A | (A) I/O error Positions | 1 | 1 | 0 | 1 | 0 | | |
| | | | | | | | | | |
| | | | | | | | | | |
| | | | | | | | | | |
BAD LIST
(BL)
Fig. 5e
| ROW | COLUMN | BIT POSITION | EV2 | RF2 | CF2 |
|---|---|---|---|---|---|
| Row Addr B | Col Addr C | (C) I/O error Positions | 1 | | |
| | | | | | |
| | | | | | |
| | | | | | |
ASSOCIATED BAD LIST
(ABL)
Fig. 5f

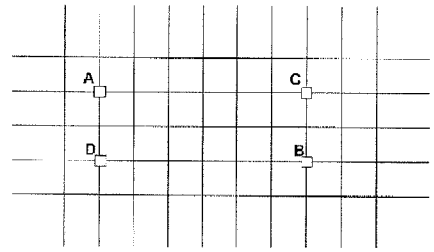
Fig. 6a
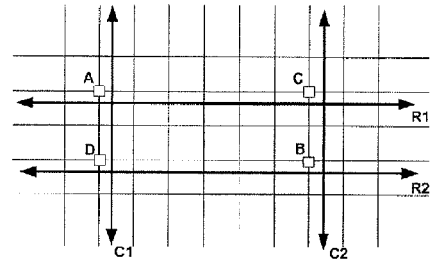
Fig. 6b
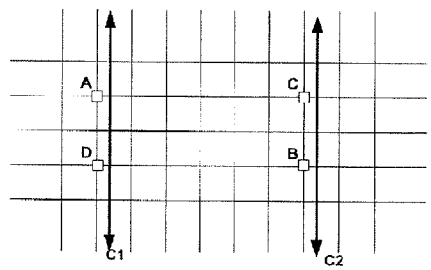
Fig. 6c
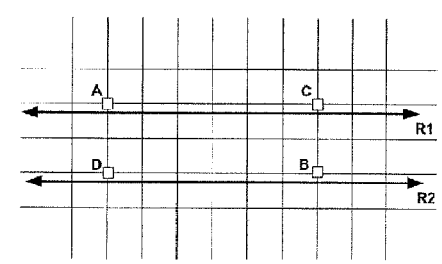
Fig. 6d
BAD LIST (BL)
Fig. 6e
ASSOCIATED BAD LIST (ABL)
Row Addr B = Row Addr D
Col Addr B = Col Addr C
Fig. 6f

METHOD AND SYSTEMS FOR MEMORY TESTING AND TEST DATA REPORTING DURING MEMORY TESTING

CROSS-REFERENCE TO RELATED APPLICATIONS

This application is a continuation of U.S. application Ser. No. 12/766,809 filed Apr. 23, 2010 (now U.S. Pat. No. 7,958, 413), which is a divisional application of U.S. application Ser. No. 11/679,133 filed Feb. 26, 2007 (now U.S. Pat. No. 7,734, 966), which is a divisional application of U.S. application Ser. No. 10/734,420 filed Dec. 11, 2003 (now abandoned), which claims priority under 35 U.S.C. §119(e) to U.S. Provisional Application No. 60/436,805, filed Dec. 26, 2002. The disclosures of the applications referenced above are incorporated herein by reference.

BACKGROUND OF THE INVENTION

1. Field of the Invention

The present invention relates to memory testing, and more specifically to efficiently testing and reporting failed memory locations as well as to efficiently allocating redundant resources to repair defective memory locations.

2. Description of the Related Art

One of the first steps in memory repairing is to determine failed memory locations, usually by writing data to an array of memory locations, reading data from those memory locations, and then comparing the read data to the data previously written to determine failed memory locations.

Memory testing has involved using an external memory tester with direct access to the memory's control, address and data pins. As the memory is tested, the row address, column address and the failed I/O position of each failed memory location are stored in the external memory tester for redundancy repair analysis. Typically the results of the analysis are used by a fusing cutting machine to determine which fuses to cut or anti-fuses to connect. Direct access memory testing is done at the external memory testing speed, which can be many times slower than the intended memory operating speed. As a result, it may not be possible to detect memory failures occurring at the memory operating speed. In addition, in direct access memory testing, all memory pins must be routed back to the chip pads to be directly accessed by the external memory tester. For many designs, this routing is not feasible.

Another memory testing approach is built-in self-test (BIST), which embeds parts of the testing circuitry in the memory to be tested, instead of solely depending on the external memory tester. The BIST executes a set of algorithmic verification tests directly on the memory array. Conventionally, the BIST receives clock signals and test data from the external memory tester, and reports failed memory locations to the external memory tester for redundancy repair analysis. The BIST typically runs at the external memory tester frequency, which can be substantially lower than the memory operating frequency. As a result, memory failures occurring at the memory operating frequency still are not detectable. Another BIST shortcoming has been the latency of data transmission between the BIST and the external memory tester. For a memory with row and column failures, the BIST reports as many as 512 failures per test set for each row failure, and similarly for column failures. Consequently, thousands of failed memory locations may be reported, even though many or most of them are redundant. In addition, the narrow data path from the BIST to the external memory tester requires many tester clock cycles to transfer information for just one failed memory location. Thus, the testing time, i.e., thousands of failed memory locations multiplied by the number of clock cycles to transfer information for one failed memory location, becomes relatively substantial.

It would be advantageous to provide a method and system for more efficient testing and reporting of failed memory locations.

SUMMARY OF THE INVENTION

In view of the foregoing, it is one object of the present invention to provide a memory testing system, which raises the speed of memory testing and is able to detect memory failures occurring at the memory operating frequency. In one embodiment, the inventive memory testing system comprises a first memory tester, an interface, and an external memory tester. In this embodiment, the first memory tester extracts failed memory location information from the memory at the memory operating frequency, and the external memory tester clocks out failed memory location information at the memory tester frequency.

In accordance with another aspect of the present invention, a memory testing method extracts failed memory location information from a memory at the memory's operating frequency by being implemented in the same medium, and reports the failed memory location information at a slower frequency, such as a memory tester frequency. When a failed memory location is detected, the external memory tester issues data strobes at the memory tester frequency to clock out failed memory location information. During the memory testing, the only time the memory tester strobes is when the failed memory locations are detected.

It is another object of the present invention to provide a memory testing and error reporting system which comprises a first memory tester, an interface, an external memory tester and an error reporting reduction module (ERR). The error reporting reduction module extracts unique failing addresses, determines if there are associated row and/or column failures, and compiles a bad location list (BL) and an associated bad location list according to the received error information. With these lists, the present invention only reports minimum information for the external memory tester to decide a row failure, a column failure or a bit failure.

It is another object of the present invention to provide a reduced data reporting method to reduce the memory testing time further. The present invention reports only enough information to the external memory tester for it to determine row, column and single bit failures repairable with the available redundant resources and to appropriately assign available redundant resources to repair row, column or single bit failure types. After the BIST has reported a predetermined number of failed memory locations in the same row, it will not report any further failed memory locations with the same row address. Similarly, after reporting a predetermined number of column failures, the BIST will not report any further failed memory locations with the same column address. In one embodiment, two failed memory locations in the same row are enough to determine a row failure, and two failed memory locations in the same column are enough to determine a column failure. The predetermined number does not have to be two; it could be more than two, depending on available memory redundancy, desired accuracy, or other considerations. Single bit errors are reported only when both the row address and the column address are different from previously reported failed memory locations. If the number of reported failures exceeds the available redundant resources, the BIST will flag the memory as unrepairable.

It is a further object of the present invention to provide a memory testing and redundant resource allocating system which comprises a first memory tester, an interface, an external memory tester and a redundant resource allocation block (RRAB). Using the failed memory location addresses and flags stored in the bad location list and the associated bad location list, the redundant resource allocation block classifies the detected failed memory locations, and allocates appropriate redundant resources to repair these failed memory locations according to a predetermined priority sequence.

It is a further object of the present invention to provide a redundant resource allocating method. The redundant resource allocation block checks the flags in the bad location list and the associated bad location list to classify the failed memory locations, and allocates redundant resources according to a predetermined priority sequence.

It is also an object of the present invention to reduce the number of pins used or necessary for memory testing. In accordance with this aspect, as a result of the efficient error reporting method of the present invention, the invention uses fewer pins for data transfer between the BIST and the external memory tester, thus providing a narrower interface and reducing chip cost.

BRIEF DESCRIPTION OF THE DRAWINGS

The present invention is described herein with reference to the accompanying drawings, similar reference numbers being used to indicate functionally similar elements.

FIG. 5a shows a constellation of three failed memory locations A, B, and C.

FIG. 5b shows a redundant resource allocation used to repair the failed memory locations shown in FIG. 5a according to one embodiment of the present invention.

FIG. 5c shows a redundant resource allocation used to repair the failed memory locations shown in FIG. 5a according to another embodiment of the present invention.

FIG. 5d shows a redundant resource allocation used to repair the failed memory locations shown in FIG. 5a according to a further embodiment of the present invention.

FIGS. 5e and 5f show a bad location list and an associated bad location list used for error reporting reduction and redundant resource allocation according to one embodiment of the present invention.

FIG. 6a shows a constellation of four failed memory locations A, B, C and D.

FIG. 6b shows an inefficient redundant resource allocation used to repair the failed memory locations shown in FIG. 6a according to a conventional method.

FIG. 6c shows a redundant resource allocation used to repair the failed memory locations shown in FIG. 6a according to one embodiment of the present invention.

FIG. 6d shows a redundant resource allocation used to repair the failed memory locations shown in FIG. 6a according to another embodiment of the present invention.

FIGS. 6e and 6f show a bad location list and an associated bad location list used for error reporting reduction and redundant resource allocation according to an embodiment of the present invention.

DETAILED DESCRIPTION OF EMBODIMENTS

Objects and advantages of the present invention will become apparent from the following detailed description.

Figure 1A:
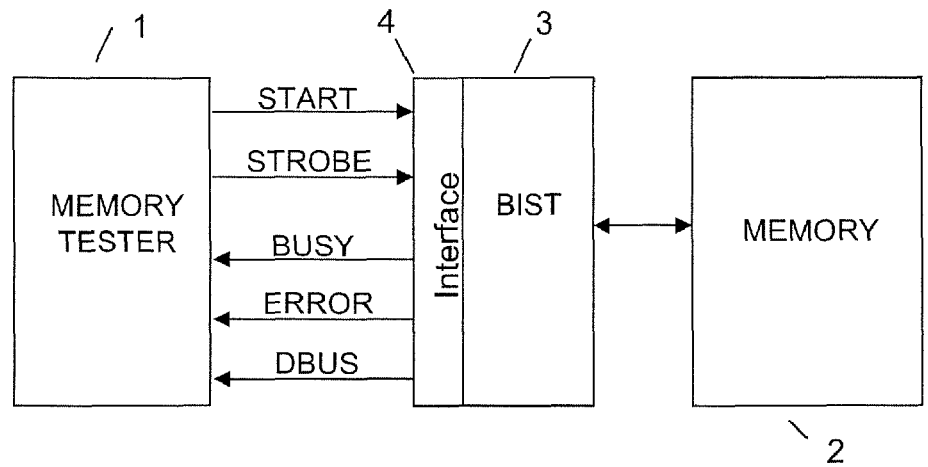
FIGS. 1a-d show four embodiments of the memory testing system of the present invention.

FIG. 1a shows an embodiment of the memory testing system of the present invention. As shown, in addition to a memory tester 1, a memory 2, and a BIST 3 as in conventional memory testing systems, the memory testing system in FIG. 1a further comprises an interface 4. The memory tester 1 sends to the interface 4 a START signal to trigger a memory testing cycle, and a STROBE signal to clock out failed memory location information from the BIST 3. The interface 4 sends to the memory tester 1 failed memory location information via data bus DBUS, a BIST BUSY signal to begin memory testing, and an ERROR signal indicating detection of failed memory locations. The BIST 3 and the memory 2 send data to each other, including test patterns and test addresses from the BIST 3, and stored test patterns from the memory 2. Thus, the stored data is read from the memory 2, then is compared with the expected data in the BIST 3 to determine failed locations which are transferred to the memory tester 1 through the interface 4.

Figure 2:
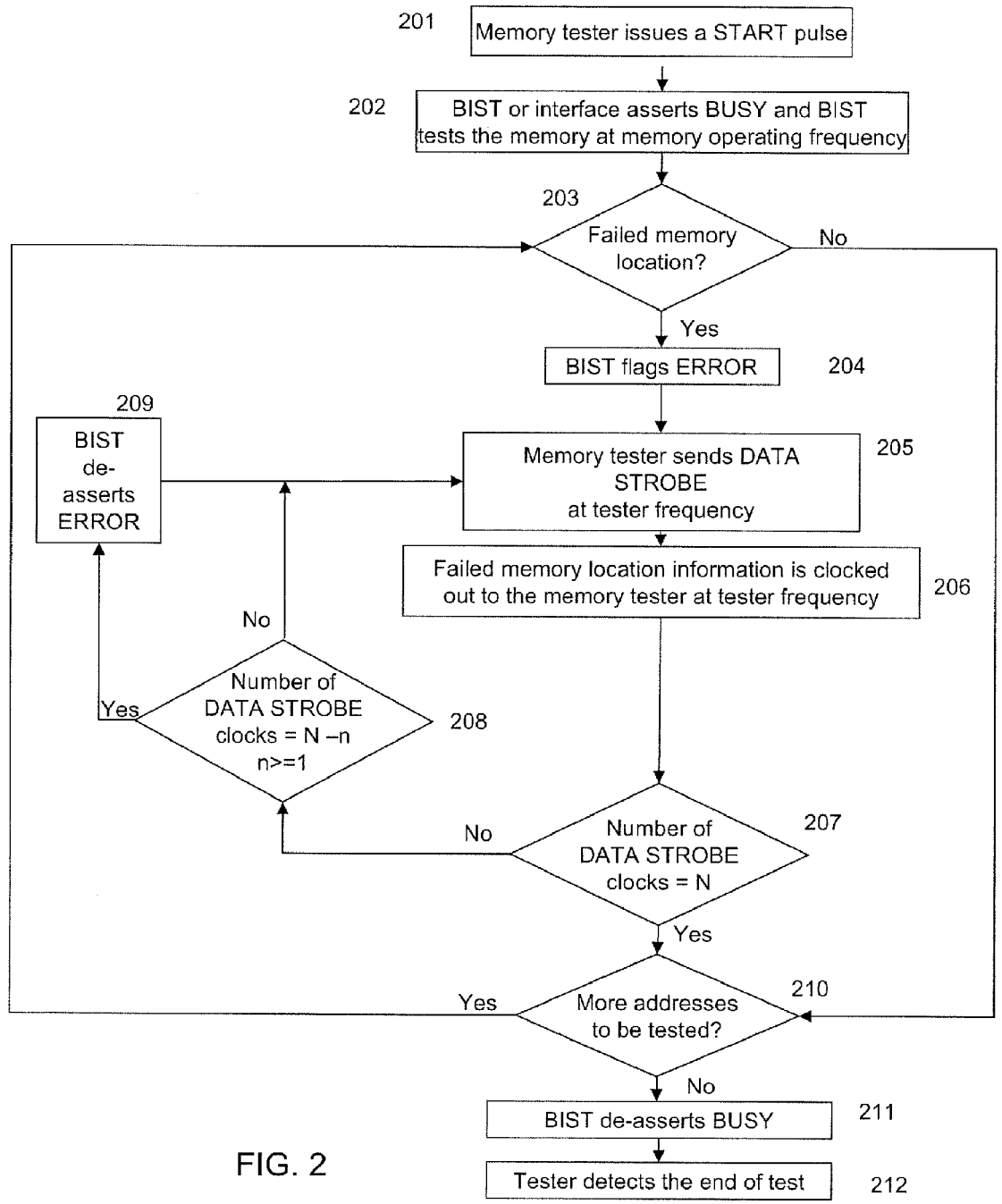
FIG. 2 shows a flow chart of implementation of the interface protocol 4 shown in FIG. 1a of the present application.
Figure 3:
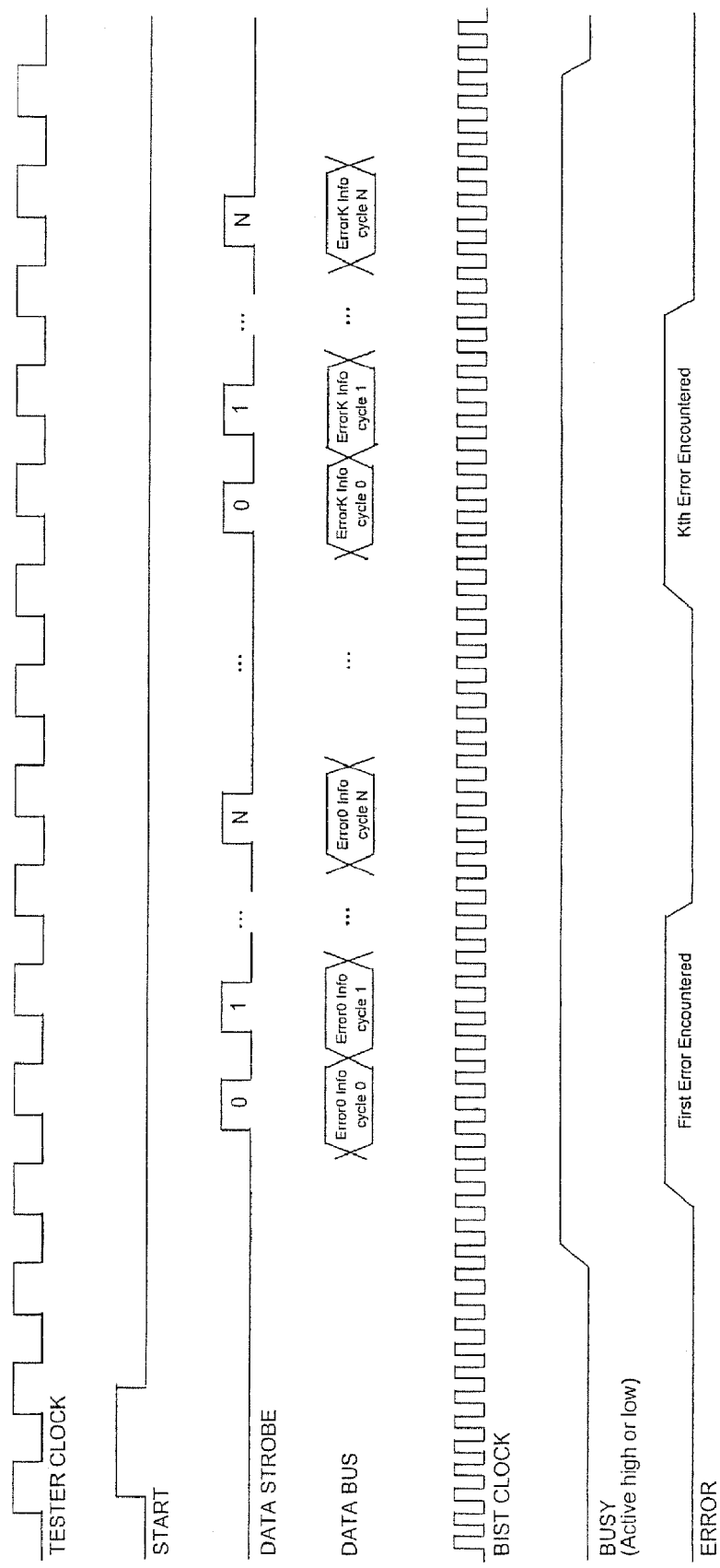
FIG. 3 is a timing diagram illustrating the states of various signals between the memory tester 1 and the interface protocol 4 of the memory testing system shown in FIG. 1a of the present application.

The implementation of the interface 4 now will be described with reference to the flow chart in FIG. 2 and the timing diagram in FIG. 3. At step 201 in FIG. 2, the memory tester 1 issues a START pulse to trigger a memory testing cycle, as shown in FIG. 3. At step 202, the BIST 3 or the interface 4 blocks response by providing a BIST BUSY signal, and starts to test the memory at the memory operating frequency. In this respect, the inventive memory system differs from previous systems. In the invention, after the START signal from the memory tester 1, the BIST 3 tests memory 2 at the memory operating frequency, rather than at the frequency of the memory tester 1.

If a failed memory location is detected at step 203, the ERROR flag comes up at step 204, as shown in FIG. 3, and memory testing is frozen at the failed memory location. Otherwise, the process goes to step 210, which will be described in more detail below.

At step 205, upon the detection of the ERROR assertion, the memory tester 1 starts to send to the interface 4 DATA STROBE 0-N from the next rising edge of the memory tester clock, TESTER CLK, and at the memory tester frequency, as shown in FIG. 3. At step 206, these data strobes clock out the failed memory location information from the BIST 3 to the memory tester 1 via Error Information cycles 0-N on data bus at the memory tester frequency.

At step 207, the BIST detects whether the number of data strobes is N, the value of which is the minimum number of data strobes required to clock out all necessary information about a failed memory location, and is known to both the memory tester 1 and the BIST 3. ERROR can be de-asserted any time between cycles 1 to N-1. If the number of data strobes is not N at step 207, it is determined at step 208 whether the number of data strobes is N-n, wherein n is an arbitrary determined by an operator in actual implementation and n≧1. If not, the process returns to step 205 directly. Otherwise, the process proceeds to step 205 after the BIST de-asserts ERROR at step 209.

If the number of data strobes is N, the process goes to step 210 to see if there are more memory addresses to be tested. If yes, the system repeats steps 203 to 210. Otherwise, the BIST 3 de-asserts BUSY at step 211, and the tester detects the end of the test at step 212.

Upon detection of BUSY de-assertion, the memory tester 1 signals the end of the memory testing cycle. The failed memory location information, if any, will be used to analyze whether the memory is prime, defective but repairable, or unrepairable. The memory testing system then waits for the next START signal to test the next memory die. To avoid deadlock in case the interface protocol 4 or the BIST 3 is defective, the memory tester 1 will time out and test the next die after a predetermined amount of time.

According to one embodiment of the present invention, the error information cycles on the DBUS and the data strobes are timed relative to the memory tester clock, TESTER CLK. At the same time, the memory is tested at the BIST clock, BIST CLK, which is the same as the memory clock. Thus, the interface 4 works as a handshake between the memory tester 1 and the BIST 3. On one side of the interface 4, the memory 2 is tested at the memory operating frequency. On the other side of the interface 4, failed memory location information is reported to the memory tester 1 at the memory tester frequency. The data strobes synchronized to the memory tester clock are used to clock out failed memory location information obtained at the memory operating frequency.

The method and system of the present invention test memory at the relatively high memory operating frequency, thus considerably increasing the memory testing speed, and enabling detection of memory failures occurring at the memory operating frequency. Furthermore, the only time the memory tester 1 clocks is when a failed memory location is detected. As a result, the present invention alleviates problems caused by latency of data transmission between the memory tester 1 and the BIST 3.

Figure 1B:
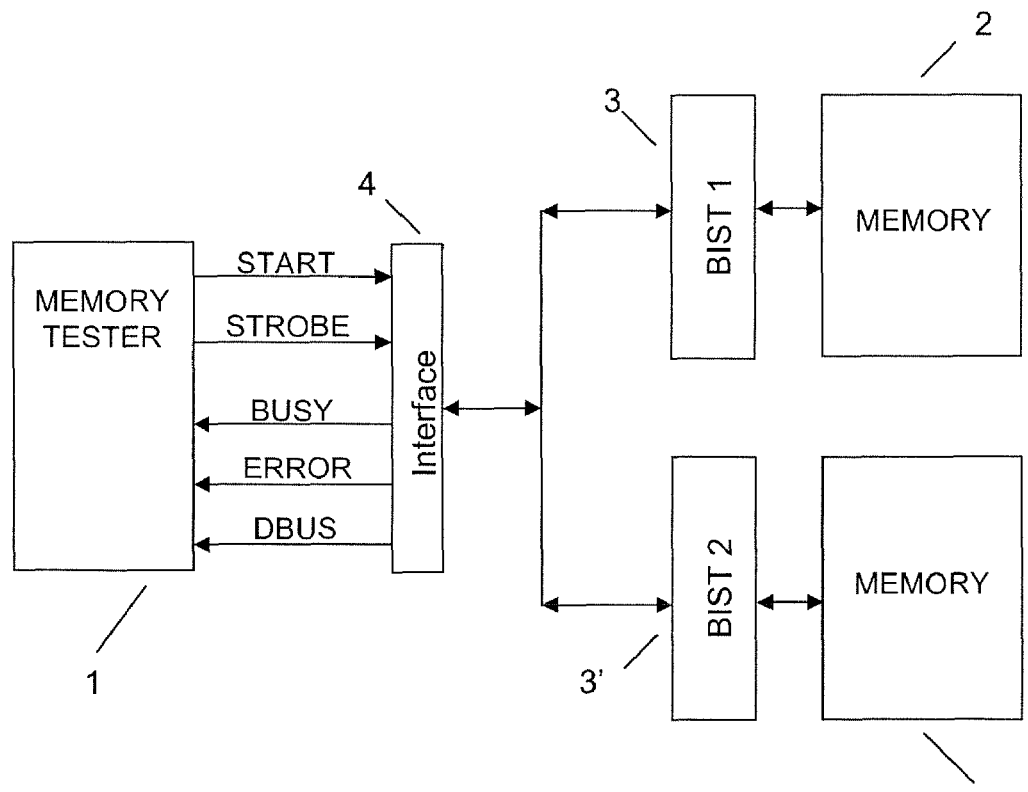

Looking now at FIG. 1b, which shows a second embodiment of the memory testing system of the present invention, memories 2 and 2' are coupled to BIST 3 and BIST 3' respectively, which in turn are coupled to the interface 4. In this embodiment, a single memory tester 1 can test multiple memories, 2, 2'. Similarly to the memory testing system shown in FIG. 1a, the interface 4 in this embodiment communicates with the memory tester 1 via the following signals: START, STROBE, BUSY, ERROR, DBUS. A variation of this embodiment is to couple multiple embedded memories to one BIST, which is coupled to the interface 4.

Figure 1C:
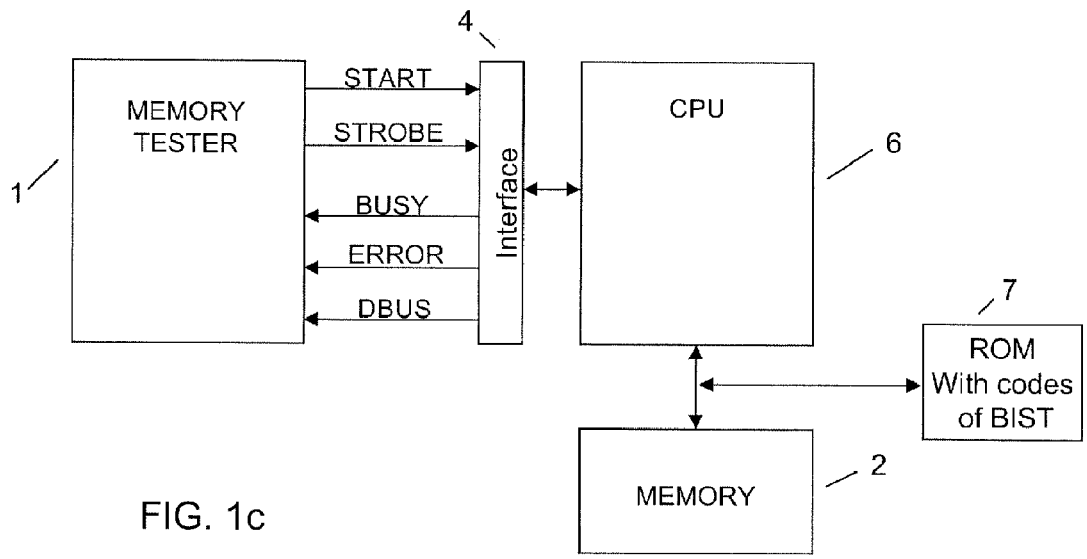

FIG. 1c shows a third embodiment of the memory testing system of the present invention, in which a CPU 6, or other processor, extracts failed memory location information from the memory, instead of BIST 3. Test patterns are loaded into the instruction memory for the CPU 6. The CPU 6 then executes the instructions from the instruction memory and tests the memory 2. The CPU 6 is coupled to the interface 4, which communicates with the memory tester 1.

Figure 1D:
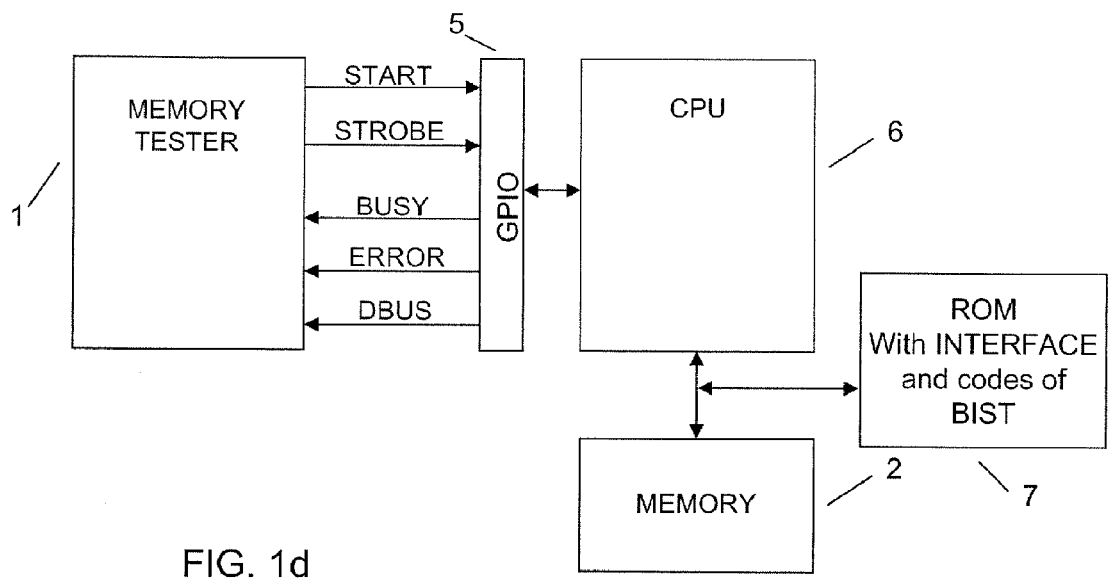

FIG. 1d shows a fourth embodiment of the memory testing system of the present invention, in which a general processor input/output interface (GPIO) replaces the interface 4 in the memory testing system shown in FIG. 1c. GPIO is an existing standard interface. Like the interface 4 in the memory testing systems shown in FIGS. 1a, 1b, and 1c, GPIO communicates with the memory tester 1 via signals START, STROBE, BUSY, ERROR and DBUS. This embodiment is an example of using an existing interface to implement the present invention. GPIO could be used with a BIST instead of a CPU.

The interface protocol of the present invention provides a handshake between the memory tester 1 and the BIST 3, but does not in any way change or limit the memory tester, the BIST, or the memory testing mechanism inside the chip. The BIST can have many different functions, and generate all kinds of different test patterns. As mentioned above, a CPU can replace the BIST to extract the failed memory location information from the memory. The memory testing system of the present invention can be used to test any kind of memory, including but not limited to, RAM, SRAM, and DRAM.

The interface 4 is very flexible, and more pins can be added, including, for example a reject pin, which signals end of test when the memory has too many failed locations to be repaired and it is useless to continue the test. Another example would be a prime die pin, which indicates a die is prime if no error has occurred when BUSY is asserted. As a further example, the width of the data bus can be adjusted as necessary.

Another aspect of the present invention is data reporting reduction during memory testing. Conventional memory testing methods have reported all failed memory locations in a row or a column. This reporting can be wasteful when there are numerous failed locations in the same row or column, because it should be possible to decide to replace a failed row or column with a redundant row or column with less failure information. Accordingly, in one embodiment, the inventive memory system only reports enough information to the memory tester for it to analyze row, column and single bit failures which are different from ones already reported and which are repairable with available redundant resources.

Figure 4A:
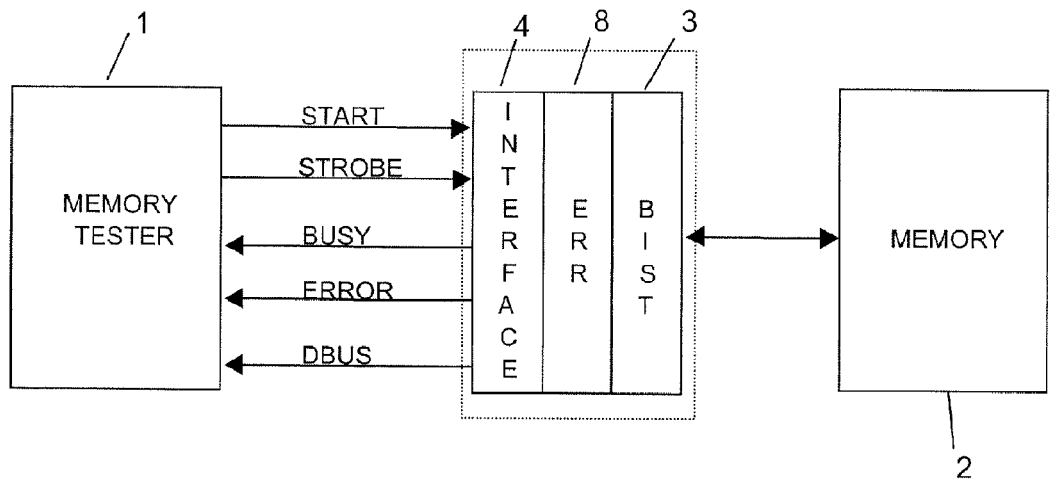
FIGS. 4a-d show four embodiments of the memory testing and error reporting system of the present invention.
Figure 4B:
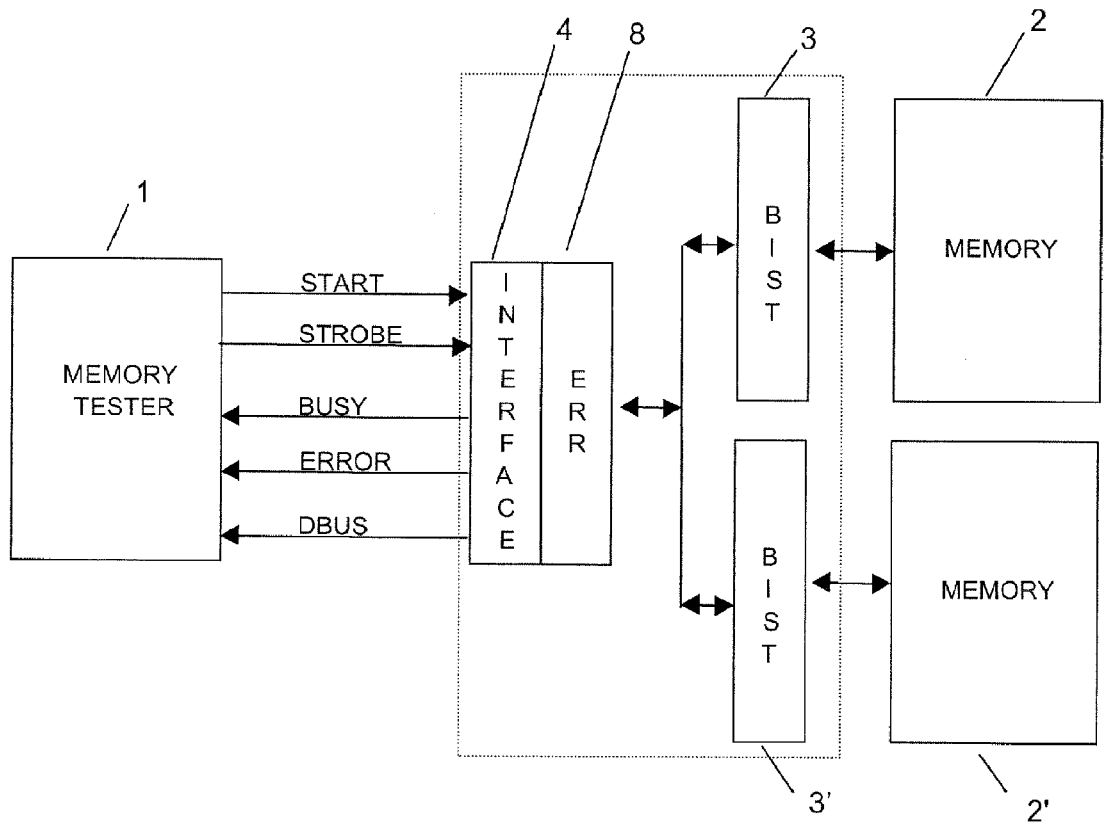
Figure 4C:
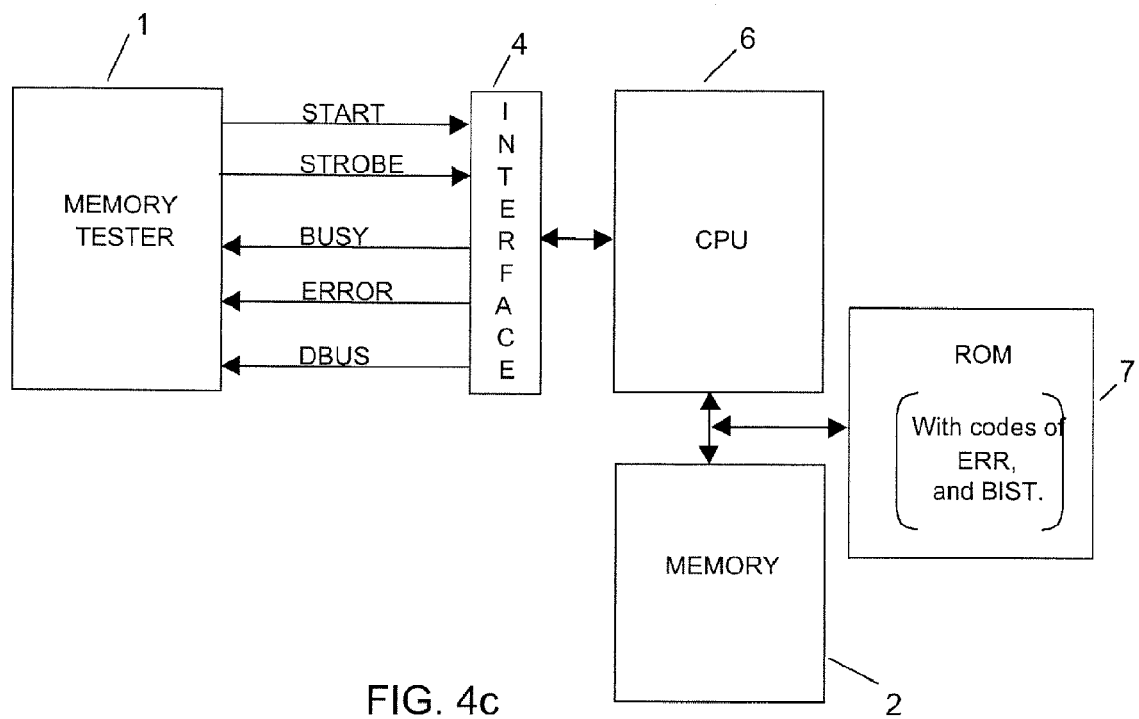
Figure 4D:
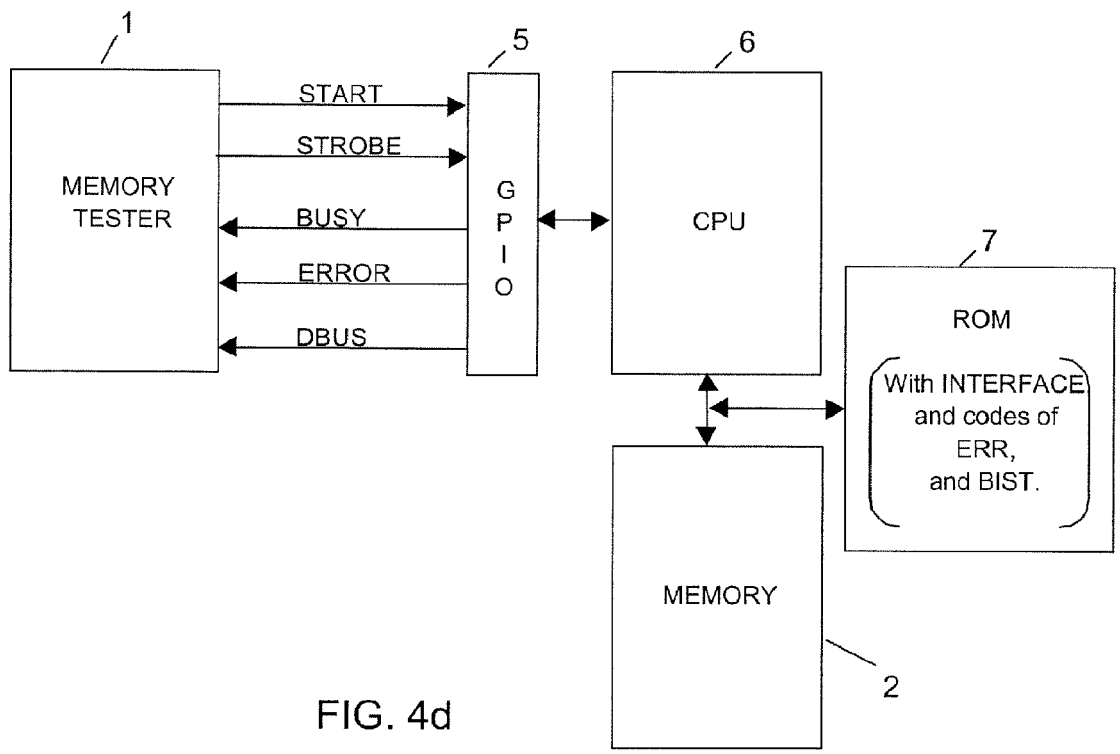

FIG. 4a shows a memory testing and error reporting system according to one embodiment of the present invention. In addition to the devices of the system shown in FIG. 1a, the system shown in FIG. 4a further comprises an error reporting reduction module 8. The error reporting reduction module can also be added to the memory testing and error reporting systems shown in FIGS. 4b-4d. In the system shown in FIGS. 4c and 4d, the codes of the error reduction reporting block and the BIST are stored in a ROM 7.

The present invention uses a bad location list and an associated bad location list to store and report a minimum amount of error information. The number of entries in the lists corresponds to the number of repairable addresses supported by the available redundant resources. The bad location list and the associated bad location list now will be described with reference to FIGS. 5a, 5e and 5f. FIGS. 5b-5d will be discussed in greater detail below.

FIG. 5a shows a constellation of three failed memory locations A, B, and C. Failed locations A and C are in the same row, and failed locations A and B are in the same column.

FIG. 5e shows a bad location list according to one embodiment of the present invention. The bad location list only stores unique addresses and bit error positions of defective memory cells. Uniqueness is determined by comparing the address fields of the current failed memory location, including row address, column address and I/O error position, with the corresponding address fields of a failed location or failed locations previously detected and stored in the bad location list. If there is no match between the address fields of the current failed memory location and the corresponding address fields of any entry in the bad location list, the current failed memory location is unique, and is stored as an entry in the bad location list. Otherwise, the current failed memory location is not unique, and cannot be stored in the bad location list. In FIG. 5e, a failed memory location A is detected as a unique location, and its row address, column address and I/O error position are stored in the row address field, column address field and bit position field of entry 0 of the bad location list. Accordingly, a flag EV, denoting a valid entry in the bad location list, is set to 1.

The bad location list is empty at the beginning of a memory test. The size of the bad location list depends on the amount of available redundant resource. The bad location list only stores repairable failed memory locations. If more bad locations are detected after the bad location list is full, the memory being tested is flagged as unrepairable.

FIG. 5f shows an associated bad location list according to an embodiment of the present invention. When one address field of the current failed memory location matches an address field of an entry in the bad location list, the present invention stores the associated address field of the current failed memory location in the associated bad location list. For example, because the row address of the failed memory location C matches the row address of the unique failed memory location A, which is stored as entry 0 in the bad location list, the column address and I/O error position of the failed memory location C are stored in the column address field and the bit position field of entry 0 of the associated bad location list. Similarly, because the column address and the I/O error position of the failed memory location B match the column address and the I/O error position of the unique failed memory location A, the row address of the failed memory location B is stored in the row address field of entry 0 of the associated bad location list. Accordingly, the entry valid flag EV2 for entry 0 in the associated bad location list, denoting more than one failed bit in the row or column, is set to 1.

Each entry in the associated bad location list has the capacity to store one row associated error address and one column associated error address. The address fields of each newly encountered failed memory location will be compared against those of the valid entries in the bad location list and the associated bad location list. Accordingly, for each entry in the bad location list, a flag RGT1 will be set to record more than one failed memory location with the same row address, and a flag CGT1 will be set to record more than one failed memory location with the same column address. As will be discussed below, in one embodiment, the present invention only reports two failed memory locations in a row or a column. Thus, when the flag RGT1 of an entry is set, the subsequent failed memory locations with the same row address will not be reported. When the flag CGT1 is set, the subsequent failed memory locations with the same column address will not be reported.

For each valid entry, an associated flag RGTX will be set to denote more than X encounters of the stored row address, and a flag CGTY will be set to denote more than Y encounters of the stored column address. X is the number of available redundant columns and Y is the number of available redundant rows, wherein $X \geq 1$, and $Y \geq 1$. When an entry's flag RGTX is set, the failed memory locations with the same row address can only be repaired by a row, instead of by columns. When the flag CGTY is set, the failed memory locations with the same column address can only be repaired by a column, instead of by rows.

FIG. 6a shows a constellation of four failed memory locations A, B, C and D. Failed locations A and C are in the same row, and failed locations B and D are in the same row. At the same time, failed locations A and D are in the same column, and failed locations B and C are in the same column. FIGS. 6b-d will be discussed in greater detail below.

FIG. 6e shows a bad location list according to one embodiment of the present invention. When the first failed memory location, location A, is detected, the bad location list is empty. Thus, the failed memory location A is unique, and its row address, column address and I/O error position are stored in the row address field, column address field and bit position field of entry 0 of the bad location list. There is no match between the address fields of the second failed memory location, location B, and those of failed memory location A stored in the bad location list. Accordingly, failed memory location B is also unique, and is stored as entry 1 of the bad location list.

The third failed memory location C has the same row address as the failed location A, and the same column address as the failed location B. Thus, the failed location C is not unique, its column address is stored in the column address field of entry 0 of the associated bad location list while the bad list's entry 0 RGT1 flag is asserted, its I/O error position is stored in the bit position field of entry 0 of the associated bad location list, and its row address is stored in the row address field of entry 1 of the associated bad location list while bad list's entry 1 CGT1 flag is asserted.

The fourth failed memory location D has the same row address as the failed location B, and the same column address as the failed location A. Thus, the failed location D is not unique, its column address is stored in the column address field of entry 1 of the associated bad location list while bad list's entry 1 RGT1 flag is asserted, its I/O error position is stored in the bit position field of entry 1 of the associated bad location list, and its row address is stored in the row address field of entry 0 of the associated bad location list while bad list's entry 0 CGT1 flag is asserted.

The information and flags in the bad location list and the associated bad location list indicate that failed memory locations A, B, C and D constitute the four vertices a rectangle. This is evident by the fact that associated bad list entry 0's column address field content is same as column address field of bad list entry 1; associated bad list entry 0's row address field contents is same as row address field contents of bad list entry 1.

Figure 7:
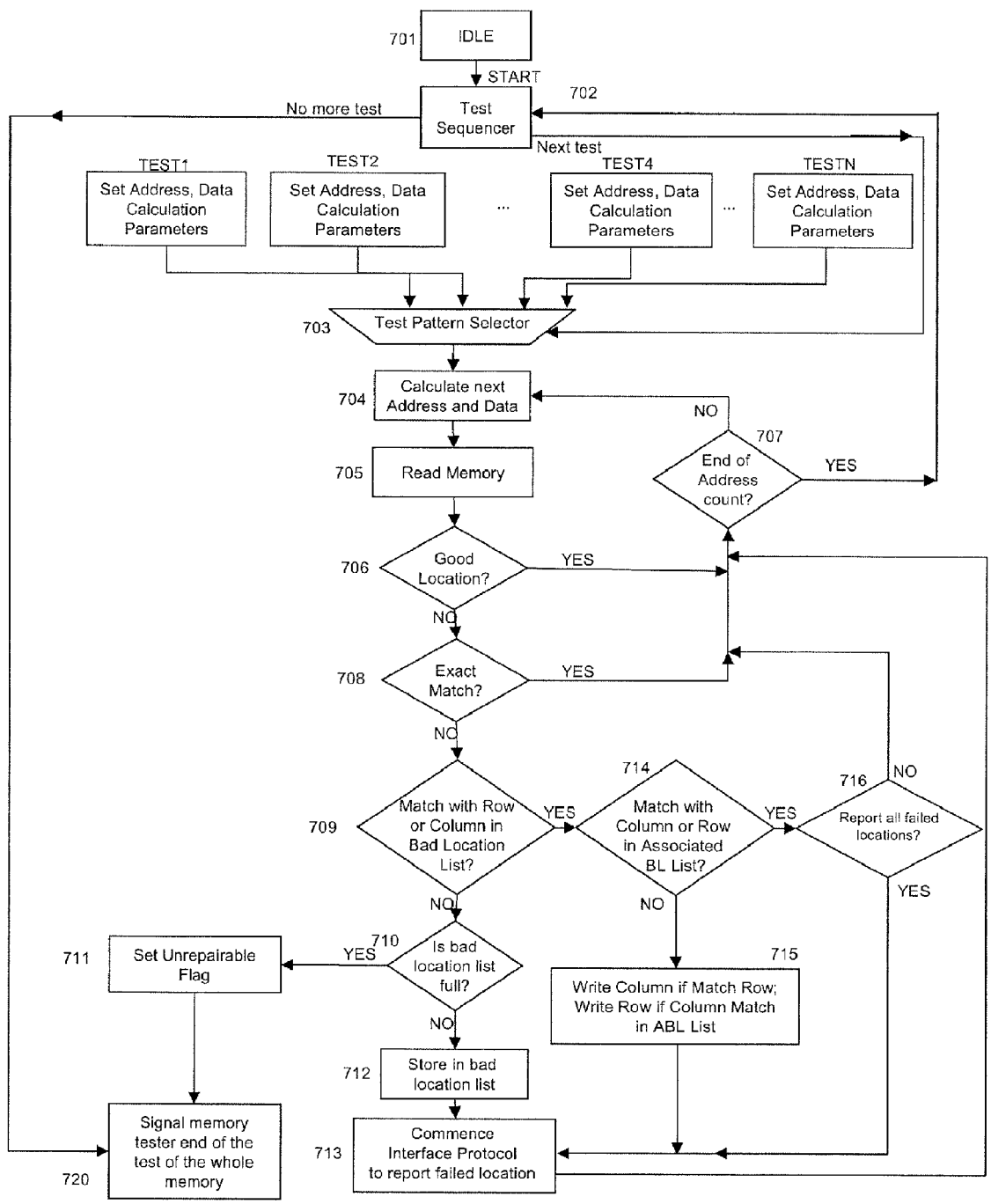
FIG. 7 shows a flow chart of a reduced data reporting method according to an embodiment of the present invention.

FIG. 7 shows a flow chart of an embodiment of the reduced data reporting method of the present invention, as implemented in the memory testing system shown in FIG. 4a. The reduced data reporting method can work with various memory testing systems, and is not limited to use with testing system as described specifically here.

At step 702, a test sequencer of the BIST 3 signals a test pattern selector to select a test pattern from among a plurality of tests and test patterns. The test pattern selector makes the selection at step 703. The BIST 3 then calculates next address and data at step 704, and reads memory at step 705. At step 706, the BIST 3 compares the data read from a memory location with data previously written therein to determine whether the memory location is good. If yes, the BIST 3 determines at step 707 whether it is the last address being read. If not, the process returns to step 704. If so, the process goes back to step 702 to sequence for the next test. The test sequencer then either starts a new test or signals the memory tester 1 the end of the memory test.

At step 708, it is determined whether the addresses of the current bad location exactly match those of bad locations found before. If yes, the process proceeds to step 707. Otherwise, the current bad location is a new bad location, and the process proceeds to step 709.

At step 709, the address fields of the current bad location, including its row address, column address and I/O error position, are compared with their counterparts of failed memory locations previously found and stored in a bad location list.

If there is no match between the address fields of the current bad location and the entries in the bad location list, i.e., all address fields of the current bad location are unique, the error reporting reduction module 8 determines whether the bad location list is full at step 710. If so, the BIST 3 sets an unrepairable flag at step 711, and at step 720, signals the memory tester 1 the end of the memory test. If not, the information about the current bad location is stored in the bad location list at step 712. At step 713, the error reporting reduction module 8 reports to the memory tester 1 the information about this failed memory location. Clocking of errors may occur as shown in the flow chart in FIG. 2. The process then returns to step 702 to sequence for the next test.

Looking again at step 709, if any of the address fields of the current bad location matches at least one entry in the bad location list, the error reporting reduction module 8 checks at step 714 whether there is a match between addresses of the current bad location and entries in the associated bad location list. If not, at step 715, the column address of the current bad location is written in the associated bad location list when the row address of the current bad location matches an entry in the bad location list, or the row address of the current bad location is written in the associated bad location list when the column address of the current bad location matches an entry in the bad location list.

In one embodiment step 716 is used as a switch between the inventive method and the prior art. At step 716, if the memory testing and error reporting system is configured to operate according to the present invention, it will not report to the memory tester 1 the current failed location which matches an entry in the associated bad list and has been reported twice. Instead, the process goes to step 707 to continue to test the next location. In one embodiment, the error reporting reduction module 8 only reports X+1 failed locations in a row, or Y+1 failed locations in a column respectively, but not failed locations thereafter in the same row or column. It should be understood that the number of reported failed memory locations could be determined in other ways. Alternatively, if the memory testing system is configured to operate conventionally, it will report all failed locations, and the process goes to step 713 to report information about the failed location.

The reduced data reporting method of the present invention can be implemented in hardware or software. When a CPU is used to extract failed memory location information from the memory 2, as shown in FIGS. 1c and 1d, the test patterns and the algorithm may be stored in the ROM 7 or other storage devices, and the CPU may execute the algorithm.

It should be understood that FIG. 7 only shows essential parts of the flow chart of the reduced data reporting method, and not a complete flow chart. For example, a skilled artisan would appreciate how to determine whether an address field of a failed memory location has been matched more than once, so no details about this aspect are provided here. Additionally, a skilled artisan also would know that a number of conditions need to be satisfied during execution of the method, so such conditions are omitted here for the sake of brevity.

The present invention significantly reduces data reported from the BIST 3 to the external memory tester 1. As a result, fewer pins are needed for parallel data transfer between the BIST and the external memory tester. Thus, the present invention can work with a narrower interface, with enhanced throughput while reducing chip and test costs. This is especially advantageous when there are pin limitations on the chips.

Figure 8A:
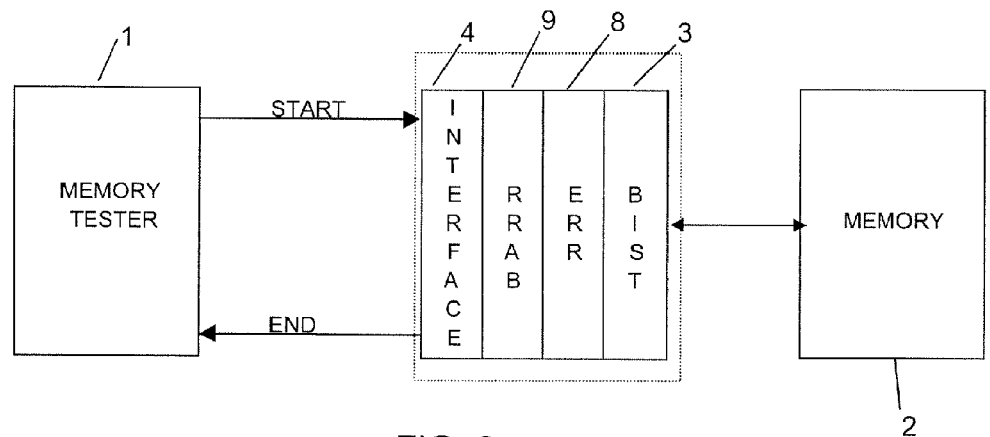
FIGS. 8a-h shows memory testing and redundant resource allocating systems according to eight embodiments of the present invention.
Figure 8B:
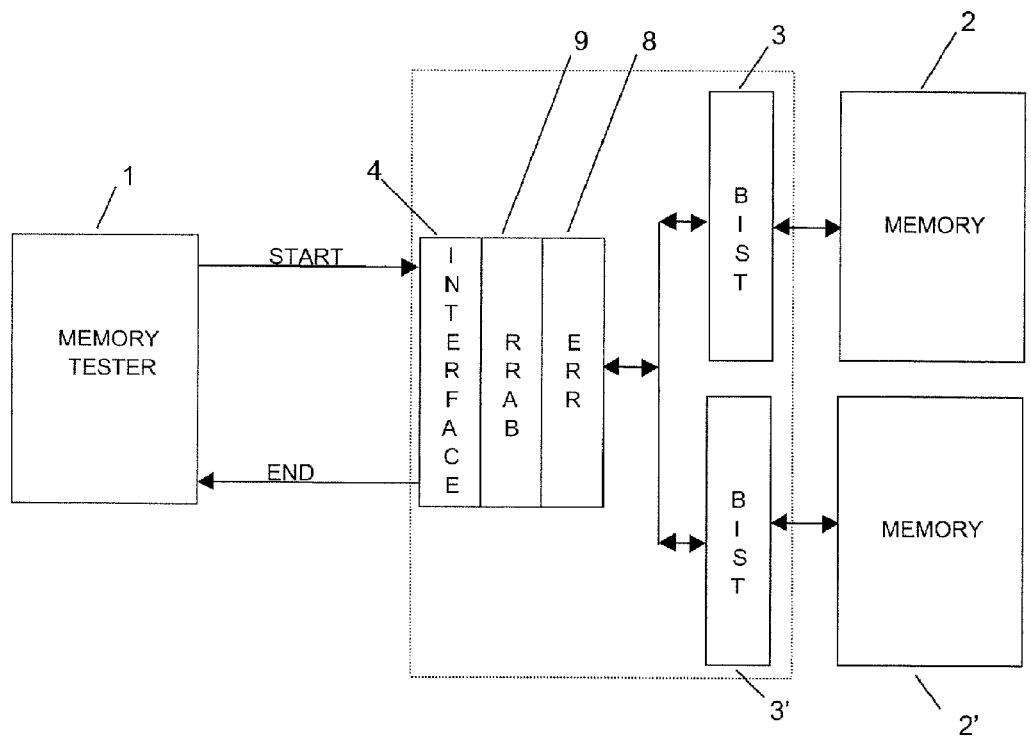
Figure 8C:
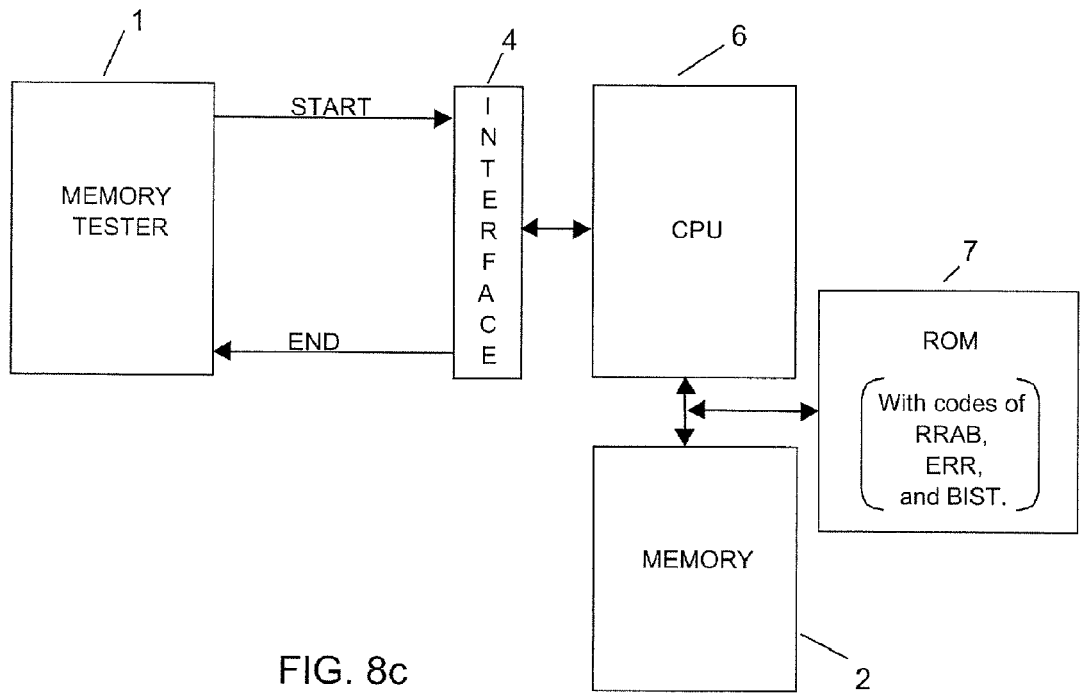
Figure 8D:
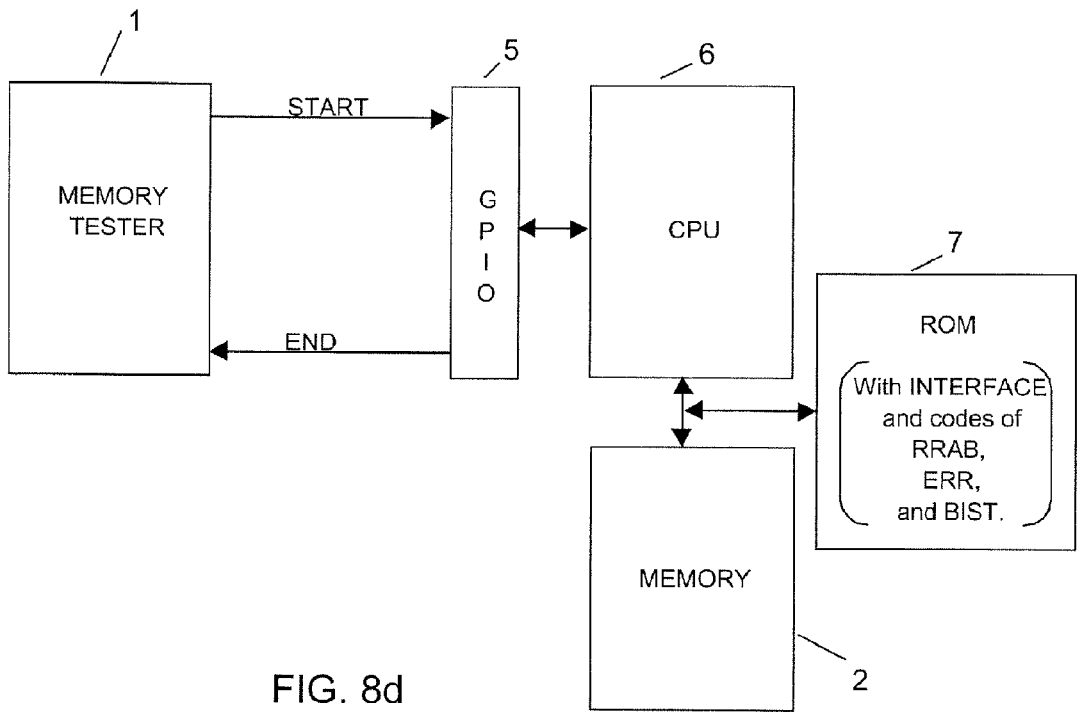
Figure 8E:
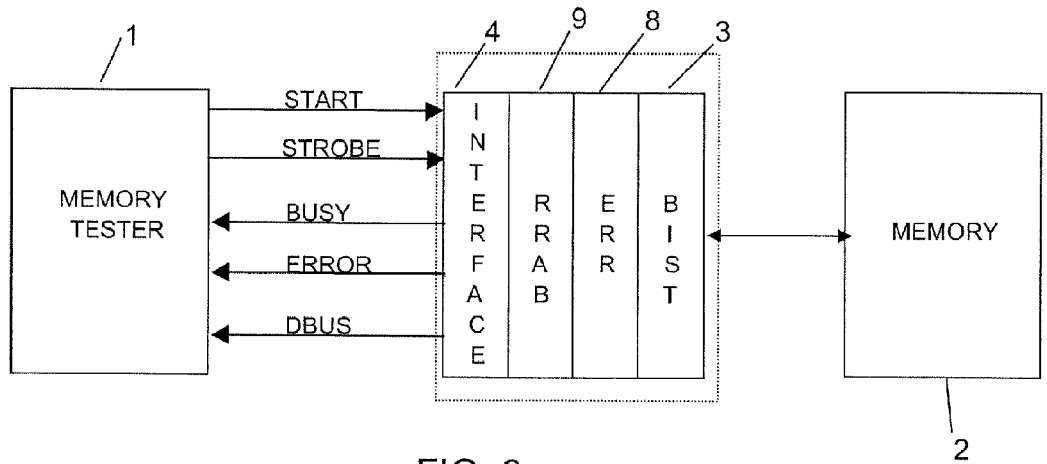
Figure 8F:
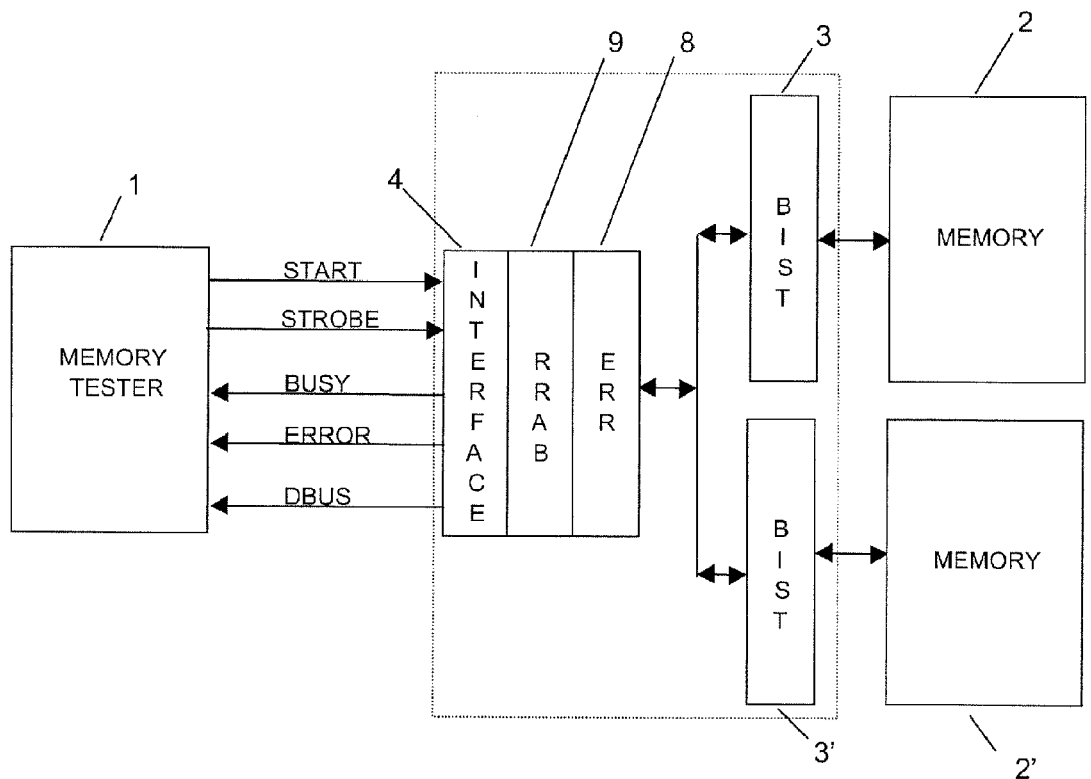
Figure 8G:
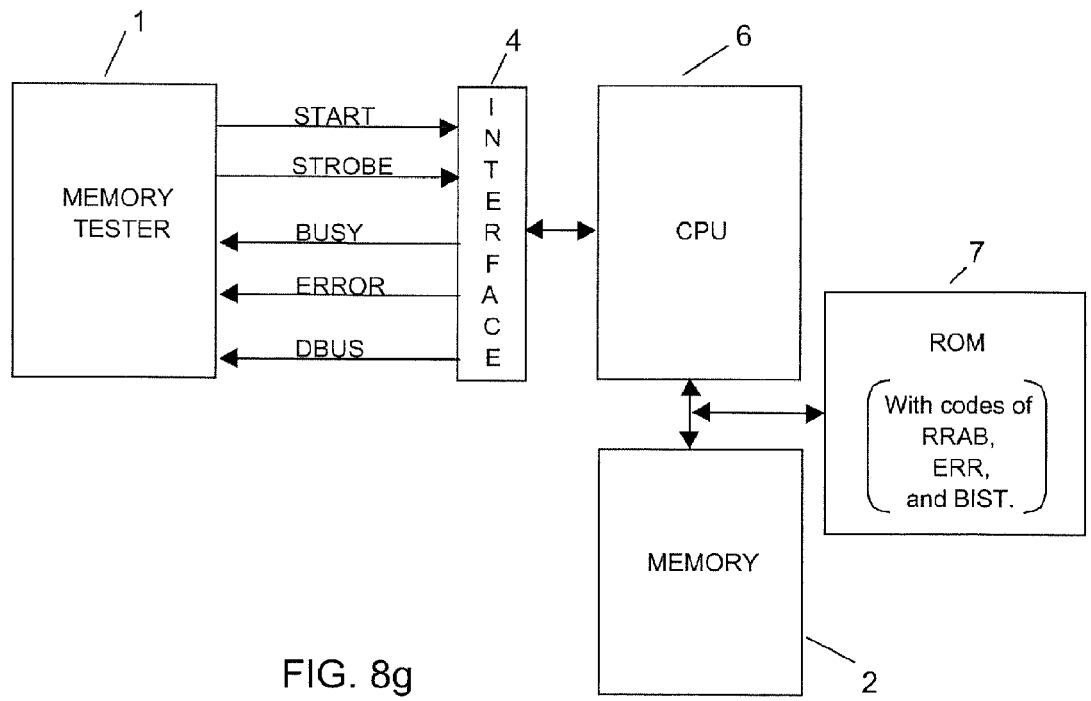
Figure 8H:
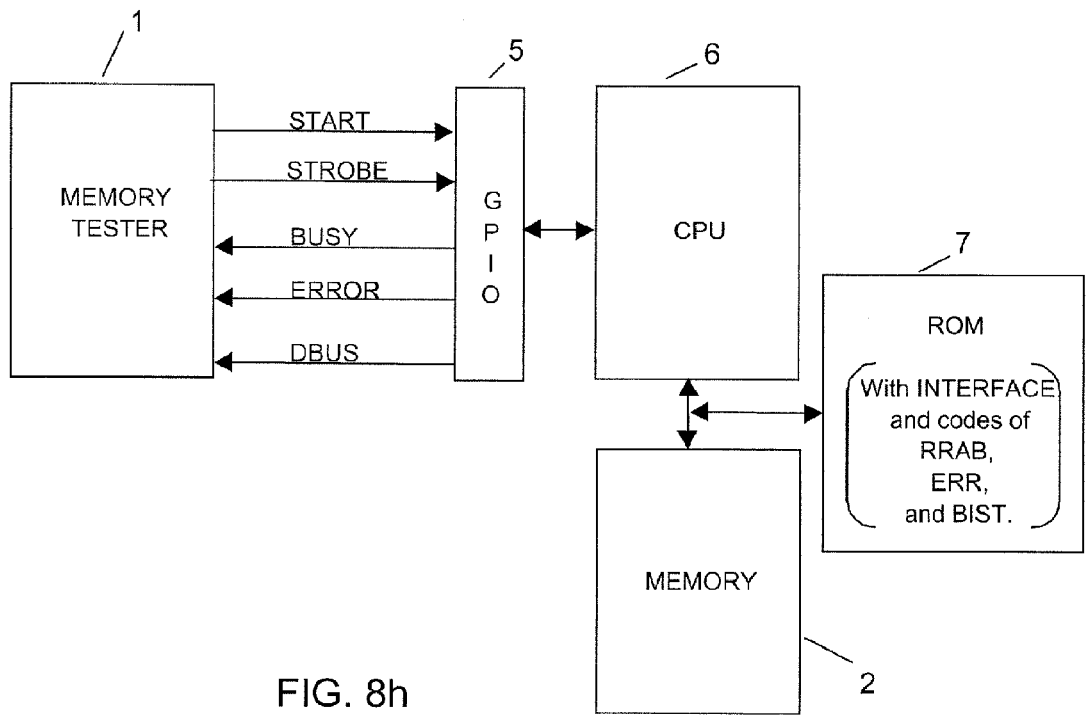

FIG. 8a shows a memory testing and redundant resource allocating system according to an embodiment of the present invention. In addition to the devices shown in FIG. 1a, the memory testing system shown in FIG. 8a further comprises a redundant resource allocation block (RRAB) 9. The redundant resource allocation block 9 can also be added to the memory testing systems shown in FIGS. 1b-d. In the systems shown in FIGS. 8c and 8d, the codes of the redundant resource allocation are stored in the ROM 7. The redundant resource allocation block 9 uses the bad location list and the associated bad location list compiled during the error reduction reporting process to efficiently assign the available redundant resources.

When there are available electrically programmable non-volatile storage elements on the same substrate as the memory under test, the present invention can feed failed memory location information directly to the non-volatile memory circuitry to store the failed locations along with their repair classification. This information is fed to the memory's repair mechanism. Thus, there is no need for an external mechanism to perform redundant resource allocation functions, no need to report the failed memory location data to an external memory tester, and no need to communicate redundant resource allocation information to a BIST. Both the interface 4 and the external memory tester 1 shown in FIG. 8a can be significantly simplified, and the time and cost for memory testing and repairing are also significantly reduced. Almost any type of low cost tester can be used to interface with the system shown in FIGS. 8a-d, as long as it can start testing of a chip and move to the next chip when testing of one chip is finished.

For non-electrical fuses, it is necessary to have an external mechanism to perform redundant resource allocation functions, and the signals between the external memory tester 1 and the BIST include STROBE, BUSY, ERROR and DBUS, as shown in FIG. 8e-h.

Figure 9:
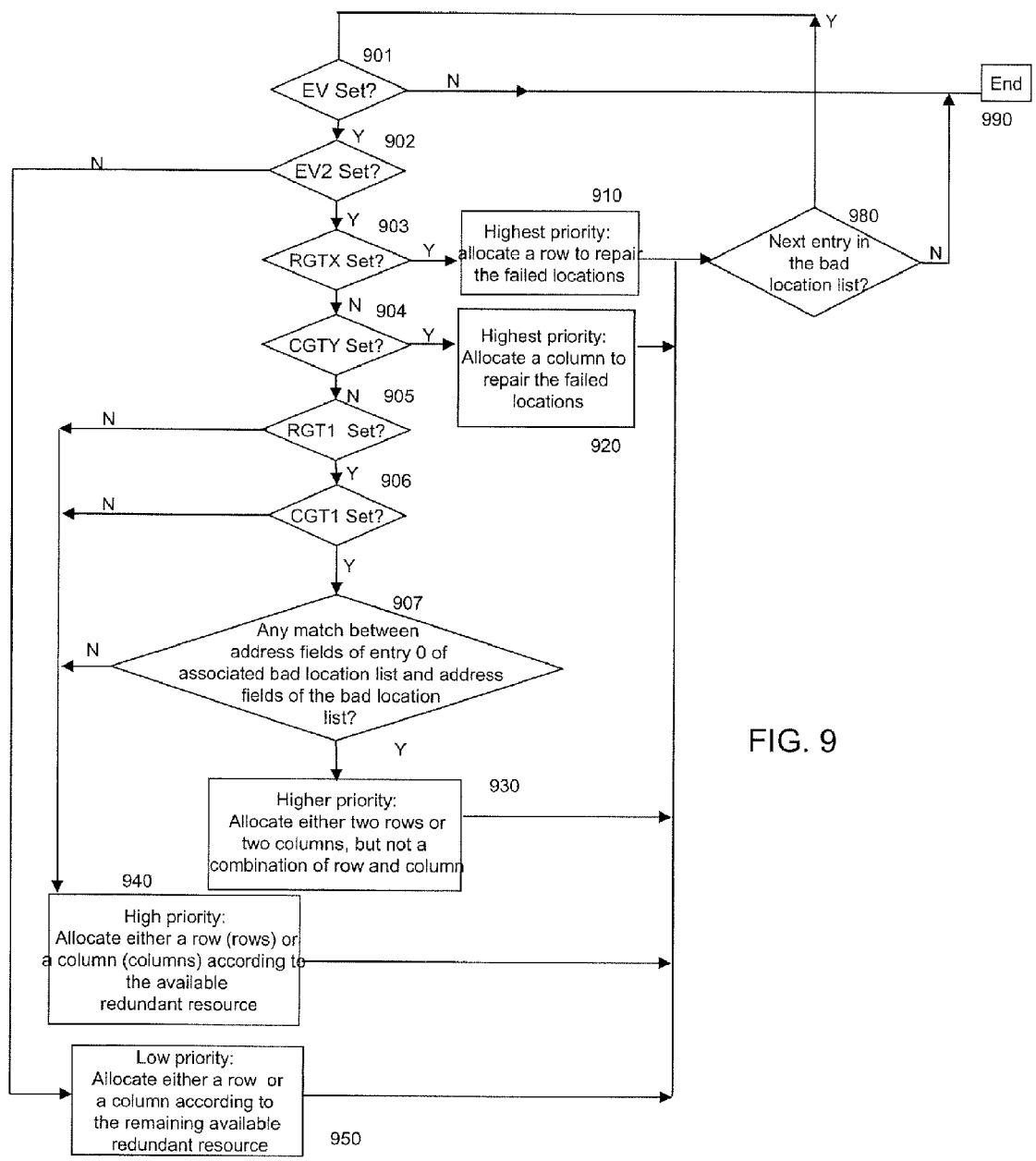
FIG. 9 shows a flow chart of a redundant resource allocating method in accordance with an embodiment of the present invention.

FIG. 9 shows a flow chart of the redundant resource allocating method in accordance with one embodiment of the present invention. In this embodiment, there are two available redundant columns and two available redundant rows, i.e., X=2, and Y=2.

At step 901, the redundant resource allocation block 9 checks whether the entry valid flag EV of entry 0 of the bad location list is set. If not, there is no failed memory location in the memory under test, and the process ends at step 990.

If the flag EV of entry 0 of the bad location list is set, at step 902, the redundant resource allocation block 9 checks whether the flag EV2 of entry 0 of the associated bad location list is set. If not, there is no failed memory location on the same row or column as entry 0 in the bad location list, and the process proceeds to step 950. The failed memory location stored in entry 0 of the bad location list is a signal bit error, has low priority, and will be repaired by either a redundant row or a redundant column.

If the flag EV2 of entry 0 of the associated bad location list is set, at step 903, the redundant resource allocation block 9 checks whether the flag RGTX of entry 0 of the bad location list is set. If so, there are more than X failed memory locations on the same row as entry 0 of the bad location list. These failed memory locations are errors with the highest priority, which can only be repaired by a row, instead of columns. The redundant resource allocation block 9 then allocates a row to repair these failed locations at step 910. The process then proceeds to step 980.

If the flag RGTX of entry 0 of the bad location list is not set, at step 904, the redundant resource allocation block 9 checks whether the flag CGTY of entry 0 of the bad location list is set. If so, there are more than Y failed memory locations on the same column as the entry 0 of the bad location list. These failed memory location are errors with the highest priority, and can only be repaired by a redundant column, instead of redundant rows. The redundant resource allocation block 9 then allocates a column to repair these failed locations at step 920. The process proceeds to step 980.

If the flag CGTY of entry 0 of the bad location list is not set, at step 905, the redundant resource allocation block 9 checks whether the flag RGT1 of entry 0 of the bad location list is set. If not, the process proceeds to step 940, where the redundant resource allocation block 9 allocates either a row or a column to repair the failed locations, according to the available redundant resource.

If the flag RGT1 of entry 0 is set, at step 906, the redundant resource allocation block 9 checks whether the flag CGT1 of entry 0 is set. If not, the process proceeds to step 940.

If the flag CGT1 of entry 0 is set, at step 907, the row address and column address of entry 0 in the associated bad list are compared against all of the addresses stored in the bad location list. A match indicates that four failed memory locations constitute a rectangle. If a match is found, at step 930, the redundant resource allocation block 9 allocates either two rows, or two columns to repair these four failed locations. To avoid waste of resources, an allocation including both a row and a column is prohibited when a four bit rectangular constellation is found. The four bit rectangular constellation are errors with the second highest priority.

For example, as shown in FIGS. 6a, 6e and 6f, the row and column addresses of a unique failed memory location A are stored as entry 0 of the bad location list. The failed memory location C has the same row address as the failed location A, and the failed memory location D has the same column address as the failed location A. As described above, the column address of the failed location C is stored in the column address field of entry 0 of the associated bad location list, and the row address of the failed location D is stored in the row address field of entry 0 of the associated bad location list. Because both flag RGT1 and flag CGT1 are set, the redundant resource allocation block 9 compares address fields of entry 0 of the associated bad location list against all addresses stored in the bad location list. Since row address D matches row address B, and column address C matches column address B, the redundant resource allocation block 20 decides that failed memory locations A, B, C and D constitutes a rectangle. Accordingly, the redundant resource allocation block 9 allocates either two rows as shown in FIG. 6d, or two columns as shown in FIG. 6c, to repair these failed locations. An allocation including both a row and a column, as shown in FIG. 6b, is not efficient for the four bit rectangular constellation, and is prohibited.

If there is no match between addresses of entry 0 in the associated bad list and the addresses stored in the bad location list, the priority of these failed memory locations is lower than the four bit rectangular constellation. At step 940, the redundant resource allocation block 9 allocates either a row or a column to repair the remaining failed memory locations, according to the remaining available redundant resources. The three bit constellation shown in FIG. 5a is an example of this type of error. As shown, failed memory location C is on the same row as the failed location A, and failed memory location B is on the same column as the failed location A. These failed locations can be repaired by two columns, as shown in FIG. 5b; or two rows, as shown in FIG. 5d; or a row or a column, as shown in FIG. 5c. The redundant resource allocation block 9 repairs these locations according to remaining available redundant resources.

Thus, the redundant resource allocation block 9 of the present invention uses the bad location list and the associated bad location list to classify the detected failed memory locations into three classes. The first class, having the highest priority, includes failed memory locations which can only be repaired by a row or a column. Redundant resources are allocated for this class first. The second class includes failed memory locations which have associated failed locations and can be repaired by either rows or columns. In the second class, a four bit rectangular constellation has priority over other failed locations. The third class, having the lowest priority, includes single bit errors which can be repaired by either a row or a column. The present invention uses the redundant resources left from allocations for the first class and the second class to repair the failed memory locations in the third class.

The status of the R flag and C flag associated with each entry in the bad list and the associated bad list. are used to indicate whether a row repair should be performed at the row address field content stored in this entry or to indicate that a column repair should be performed at the column address field content stored in this entry, or both row and column repair should be performed at the location specified by the entry's content. At the conclusion of the redundancy allocation analysis, the address field, I/O field, R flag and C flag contents of valid entries with asserted R or C flags or both in the bad list and the associated bad list are transmitted to the memory tester via the interface protocol described above.

Skilled artisans would appreciate that the methods described above can be carried out in various ways, either in software or in hardware, possibly involving programming loops or state machines.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A method for reducing data reporting during memory testing of a memory, the method comprising:
   storing a first address of a first memory location, which has a failure, in a first storage element;
   comparing a second address of a second memory location, which has a failure, with the first address; and
   continuing memory testing without reporting the second memory location if the second address matches the first address and if the first address has been matched more than a predetermined number of times;
   if the second address matches the first address, storing the second address in a second storage element; and
   if the second address is stored in the second storage element, indicating that the first address is matched an additional time.

2. The method of claim 1, wherein a capacity of the first storage element depends on available redundant resources in the memory.

3. The method of claim 1, further comprising identifying the memory as irreparable if the first storage element is full.

4. The method of claim 1, wherein the predetermined number is X+1 and X is a number of available redundant columns.

5. The method of claim 4, further comprising if the first address is a row address and if the first address has been matched more than the predetermined number of times, repairing the row of the memory having the first address.

6. The method of claim 1, wherein the predetermined number is Y+1 and Y is a number of available redundant rows.

7. The method of claim 6, further comprising if the first address is a column address and if the first address has been matched more than the predetermined number of times, repairing the column of the memory having the first address.

8. The method of claim 1, wherein the first storage element and the second storage element are in a storage device.

9. A system comprising:
a first storage element configured to store a first address of a first memory location, which has a failure;
a comparator configured to compare a second address of a second memory location, which has a failure, with the first address;
a decision unit configured to direct continued memory testing without reporting the second memory location if the second address matches the first address and if the first address has been matched more than a predetermined number of times; and second storage element configured to store the second address, if the second address matches the first address, wherein the decision unit is further configured to indicate that the first address is matched an additional time, if the second address is stored in the second storage element.

10. The system of claim 9, further comprising:
a built-in self-test (BIST) unit configured to detect failed-memory-location information for the first memory location and the second memory location for a memory; and
a memory tester configured to receive the failed-memory-location information from the BIST unit and configured to determine whether to identify the memory as prime, repairable, or unrepairable.

11. The system of claim 10, wherein the memory tester is configured to issue a start-test signal to the BIST unit to start testing the memory.

12. The system of claim 11, wherein the BIST unit includes: the first storage element configured to store the first address; a comparator configured to compare the second address to the first address; and a decision unit configured to determine whether to report the second memory location.

13. The system of claim 12, wherein the BIST unit includes the second storage element configured to store the second address.

14. The system of claim 11, wherein the BIST unit includes:
a first storing means for storing the first address;
means for comparing the second address to the first address; and
means for determining whether to report the second memory location.

15. The system of claim 14, wherein the BIST unit includes a second storing means for storing the second address.

16. The system of claim 10, wherein the memory tester is configured to issue a strobe signal to the BIST unit to collect the failed-memory-location information from the BIST unit.

17. The system of claim 10, wherein the BIST unit is configured to transfer an error signal to the memory tester to indicate that the BIST unit has detected the failed-memory-location information.

18. A method for reducing data reporting during memory testing of a memory, the method comprising:
reading first data from a first cell of the memory;
reading second data from a second cell of the memory;
determining the first cell and the second cell to be failed cells based on (i) a comparison between the first data and data expected to be stored in the first cell, and (ii) a comparison between the second data and data expected to be stored in the second cell;
storing a first address of the first cell of the memory in a first storage element;
comparing a second address of the second cell of the memory to the first address;
if (i) the second address matches the first address, and (ii) the first address has been matched more than a predetermined number of times, continuing testing of the memory without reporting the second cell as a failed cell;
if the second address matches the first address, storing the second address in a second storage element; and
if the second address is stored in the second storage element, indicating the first address matches the second address.

19. A system comprising:
a testing device configured to read (i) first data from a first cell of a memory, and (ii) second data from a second cell of the memory,
wherein the testing device is configured to determine the first cell and the second cell to be failed cells based on (i) a comparison between the first data and data expected to be stored in the first cell, and (ii) a comparison between the second data and data expected to be stored in the second cell;
a first storage element configured to store a first address of the first cell of the memory;
a comparator configured to compare a second address of the second cell of the memory to the first address;
a decision device configured to continue memory testing without reporting the second cell as a failed cell, if (i) the second address matches the first address, and (ii) the first address has been matched more than a predetermined number of times; and
a second storage element configured to store the second address, if the second address matches the first address,
wherein the decision device is configured to, if the second address is stored in the second storage element, indicate the first address has been matched.

* * * * *